United States Patent [19]
Kim

[11] Patent Number: 5,818,783
[45] Date of Patent: Oct. 6, 1998

[54] AUTOMATIC MODE SELECTION CIRCUIT FOR SEMICONDUCTOR MEMORY DEVICE

[75] Inventor: Jung Pill Kim, Kyoungku-do, Rep. of Korea

[73] Assignee: Hyundai Electronics Industries Co., Ltd., Kyoungki-do, Rep. of Korea

[21] Appl. No.: 893,542

[22] Filed: Jul. 11, 1997

Related U.S. Application Data

[63] Continuation of Ser. No. 580,200, Dec. 28, 1995, abandoned.

[30] Foreign Application Priority Data

Dec. 31, 1994 [KR] Rep. of Korea ............ 1994-40567

[51] Int. Cl.$^6$ .................................................. G11C 7/00
[52] U.S. Cl. ....................................... 365/226; 365/189.09
[58] Field of Search .......................... 365/189.09, 226

[56] References Cited

U.S. PATENT DOCUMENTS

| | | | |
|---|---|---|---|
| 5,297,097 | 3/1994 | Etoh et al. | 365/203 |
| 5,329,168 | 7/1994 | Sugibayashi et al. | 365/189.09 |
| 5,363,333 | 11/1994 | Tsujimoto | 365/189.09 |
| 5,396,113 | 3/1995 | Park et al. | 365/189.09 |
| 5,408,435 | 4/1995 | McClure et al. | 365/226 |

*Primary Examiner*—David C. Nelms
*Assistant Examiner*—Michael T. Tran
*Attorney, Agent, or Firm*—Gary M. Nath; Nath & Associates

[57] ABSTRACT

An automatic mode selection circuit for automatically selecting low voltage transistor transistor logic and high-speed input/output interface modes in a semiconductor memory device. The automatic mode selection circuit comprises an external reference voltage pad for delivering an external reference voltage, an internal reference voltage generator for generating an internal reference voltage, a power-on detector for detecting a power-on time point and then generating a pulse signal for a predetermined time period, a switching circuit for switching the external reference voltage from the external reference voltage pad and the internal reference voltage from the internal reference voltage generator in response to an output signal from the power-on detector, a reference voltage detector connected between the external reference voltage pad and the switching circuit for detecting the external reference voltage from the external reference voltage pad, a comparator for comparing an output voltage from the reference voltage detector with the internal reference voltage from the internal reference voltage generator in response to the output signal from the power-on detector, and a latch circuit for latching an output signal from the comparator and supplying the latched signal to an output terminal.

9 Claims, 17 Drawing Sheets

|  | LVTTL | High speed I/O interface |
|---|---|---|
| Vdd | 3.3V | 3.3V |
| Vddq |  | 3.3V |
| Vtt (Termination Voltage) |  | 1.5V |
| Vref |  | 1.5V |
| $V_{IH}$ / $V_{IL}$ | 2.0V/0.8V | Vref+200mV/Vref−200mV |
| $V_{OH}$ / $V_{OL}$ | 2.4V/0.4V | Vref+400mV/Vref−400mV |

Fig. 1

AUTOMATIC MODE SELECTION CIRCUIT FOR SEMICONDUCTOR MEMORY DEVICE

This application is a continuation application of U.S. patent application Ser. No. 08/580,200, filed Dec. 28, 1995, the entire contents of which are hereby incorporated in their entirety now abandoned.

BACKGROUND OF THE INVENTION

1. Field of the Invention

The present invention relates in general to automatic mode selection circuits for semiconductor memory devices, and more particularly to an automatic mode selection circuit for a semiconductor memory device which is capable of automatically selecting two modes of low voltage transistor transistor logic (referred to hereinafter as LVTTL) and high-speed input/output (referred to hereinafter as I/O) interface in the chip.

2. Description of the Prior Art

In a semiconductor memory device, there have recently been used a TTL or LVTTL and a high-speed I/O interface which are designed at bonding/metal option, respectively. In order to overcome such two-mode design, there has been proposed an automatic mode selection scheme for automatically selecting the two modes in the semiconductor chip.

FIG. 1 is a table illustrating the comparison between voltage levels of the LVTTL and high-speed I/O interface, FIG. 2 is a circuit diagram illustrating one example of the LVTTL, FIG. 3 is a circuit diagram illustrating one example of the high-speed I/O interface, and FIG. 4 is a waveform diagram illustrating output signals from the LVTTL and high-speed I/O interface in FIGS. 2 and 3.

As shown in FIG. 2, the LVTTL comprises a data output buffer 101, a comparator 102 and a parasitic capacitor C1. The parasitic capacitor C1 is formed between the data output buffer 101 and the comparator 102. The data output buffer 101 includes a PMOS transistor Q1 connected between a supply voltage source Vdd and a node N1, and an NMOS transistor Q1 connected between the node N1 and a ground voltage source Vss. The comparator 102 recognizes an output signal from the data output buffer 101 as logic high when it reaches a voltage level of 2.4V. The comparator 102 also recognizes the output signal from the data output buffer 101 as logic low when it reaches a voltage level of 4.0V.

In FIG. 3, the high-speed I/O interface comprises a data output buffer 103, a comparator 104, a termination voltage source Vtt and a termination resistor Rt. The data output buffer 103 has a limited voltage swing output characteristic by means of the termination resistor Rt. The limited voltage swing output characteristic of the data output buffer 103 makes a high-speed operation possible.

The operations of the LVTTL and high-speed I/O interface with the above-mentioned constructions will hereinafter be described with reference to FIG. 4 which is a waveform diagram illustrating output signals form the LVTTL and high-speed I/O interface in FIGS. 2 and 3.

In FIG. 4, the reference characters a and e designate high logic start points of the high-speed I/O interface and LVTTL, respectively. The reference characters b and f designate high logic recognition points of the high-speed I/O interface and LVTTL, respectively. The reference characters c and g designate low logic start points of the high-speed I/O interface and LVTTL, respectively. The reference characters d and h designate low logic recognition points of the high-speed I/O interface and LVTTL, respectively. As seen from this drawing, the high-speed I/O interface can perform the operation at a much higher speed than that of the LVTTL, because of the limited voltage swing output characteristic.

FIG. 5 is a circuit diagram illustrating the construction of a conventional automatic mode selection circuit for a semiconductor memory device. As shown in this drawing, the conventional automatic mode selection circuit comprises a PMOS transistor Q5 connected between nodes N4 and N5, a PMOS transistor Q6 connected between the node N4 and a node N6, an NMOS transistor Q7 connected between the node N5 and a node N7, an NMOS transistor Q8 connected between the nodes N6 and N7, a PMOS transistor Q9 connected between a supply voltage source Vcc an a node N8, a reference voltage pad 202 for supplying a reference voltage Vref to the node N8, and an inverter G1 connected between the node N6 and a node N9. The node N7 is connected to a ground voltage source Vss. The PMOS transistors Q5 and Q6 have their gates connected in common to the node N5. The NMOS transistor Q7 has its gate connected to a voltage generator, the NMOS transistor Q8 has its gate connected to the node N8 and the PMOS transistor Q9 has its gate connected to the ground voltage source Vss. The voltage generator is adapted to generate a voltage 2Vcc/3.

FIG. 6 is a circuit diagram illustrating the construction of a conventional input buffer for a semiconductor memory device. As shown in this drawing, the conventional input buffer comprises a PMOS transistor Q10 connected between nodes N10 and N11, a PMOS transistor Q11 connected between the node N10 and a node N14, an NMOS transistor Q12 connected between the node N11 and a node N12, an NMOS transistor Q13 connected between the node N12 and a ground voltage source Vss, an NMOS transistor Q14 connected between the node N11 and a node N13, an NMOS transistor Q14 connected between the node N13 and the ground voltage source Vss, an NMOS transistor Q16 connected between the node N14 and a node N15, an NMOS transistor Q17 connected between the node N15 and the ground voltage source Vss, an NMOS transistor Q18 connected between the node N14 and a node N16, and an NMOS transistor Q19 connected between the node N16 and the ground voltage source Vss. The PMOS transistors Q10 and Q11 have their gates connected in common to the node N11. The NMOS transistor Q12 has its gate for inputting an internal reference voltage Vref_int, the NMOS transistor Q13 has its gate connected to the LVTTL, the NMOS transistor Q14 has its gate for inputting a reference voltage Vref, and the NMOS transistor Q15 has its gate connected to the high-speed I/O interface. The NMOS transistor Q16 has its gate for receiving an input signal in, the NMOS transistor Q17 has its gate connected to the high-speed I/O interface, the NMOS transistor Q18 has its gate for receiving the input signal in, and the NMOS transistor Q19 has its gate connected to the LVTTL.

The operations of the conventional automatic mode selection circuit and input buffer with the above-mentioned constructions will hereinafter be described with reference to FIGS. 5 and 6.

In FIG. 5, the PMOS transistors Q5 and Q6 and the NMOS transistors Q7 and Q8 constitute a comparator 201. The comparator 201 compares the voltage 2Vcc/3 at the gate of the NMOS transistor Q7 with the reference voltage Vref at the gate of the NMOS transistor Q8 and supplies the compared result to the node N6. Noticeably, because the high-speed I/O interface uses the reference voltage Vref from the external reference voltage pad, it requires no additional means for generating the reference voltage Vref. The reference voltage Vref has a half voltage level Vcc/2, thereby making the high-speed I/O interface high in logic. The LVTTL receives no reference voltage. As a result, the PMOS transistor Q9 transfers the supply voltage Vcc from the supply voltage source to the LVTTL, thereby making the LVTTL high in logic.

In FIG. 6, in the case where the LVTTL is selected by the automatic mode selection circuit, the internal reference voltage Vref_int is used by the NMOS transistors Q12 and Q13. In the case where the high-speed I/O interface is selected by the automatic mode selection circuit, the reference voltage Vref is used by the NMOS transistors Q14 and Q15.

Noticeably, the output of the automatic mode selection circuit may be used in a data output buffer.

The above-mentioned conventional automatic mode selection circuit has the following disadvantages.

Firstly, the automatic mode selection circuit requires a voltage generator for generating the voltage 3Vcc/3.

Secondly, the automatic mode selection circuit requires means for switching the LVTTL/high-speed I/O interface as shown in FIG. 6. This results in the circuit becoming complicated and the speed being thus reduced.

Thirdly, in the case where the automatic mode selection circuit selects the high-speed I/O interface, the PMOS transistor Q9 transfers the supply voltage Vcc from the supply voltage source to the node N8, resulting in the formation of a current path to the reference voltage pad 202.

SUMMARY OF THE INVENTION

Therefore, the present invention has been made in view of the above problems, and it is an object of the present invention to provide an automatic mode selection circuit for a semiconductor memory device which is capable of automatically selecting two modes of LVTTL and high-speed I/O interface in the chip.

In accordance with an aspect of the present invention, there is provided an automatic mode selection circuit for automatically selecting low voltage transistor transistor logic and high-speed input/output interface modes in a semiconductor memory device, comprising external reference voltage delivery means for delivering an external reference voltage; internal reference voltage generation means for generating an internal reference voltage; power-on detection means for detecting a power-on time point and then generating a pulse signal for a predetermined time period; switching means for switching the external reference voltage from the external reference voltage delivery means an the internal reference voltage from the internal reference voltage generation means in response to an output signal from the power-on detection means; reference voltage detection means connected between the external reference voltage delivery means and the switching means for detecting the external reference voltage from the external reference voltage delivery means; comparison means for comparing an output voltage from the reference voltage detection means with the internal reference voltage from the internal reference voltage generation means in response to the output signal from the power-on detection means; and latch means for latching an output signal from the comparison means and supplying the latched signal to an output terminal.

In accordance with another aspect of the present invention, there is provided an automatic mode selection circuit with an output terminal for automatically selecting low voltage transistor transistor logic and high-speed input/output interface modes in a semiconductor memory device, comprising external reference voltage delivery means for delivering an external reference voltage; internal reference voltage generation means for generating an internal reference voltage; power-on detection means for detecting a power on time point and then generating a pulse signal for a predetermined time period; first and second switching means for switching the external reference voltage from the external reference voltage delivery means and the internal reference voltage from the internal reference voltage generation means in response to first and second switching signals from the power-on detection means and an output signal from the output terminal; reference voltage detection means connected between the external reference voltage delivery means and the switching means for detecting the external reference voltage from the external reference voltage delivery means; comparison means for comparing an output voltage from the reference voltage detection means with the internal reference voltage from the internal reference voltage generation means when the first and second switching means are temporarily turned off; and latch means for latching an output signal from the comparison means and supplying the latched signal to the output terminal.

BRIEF DESCRIPTION OF THE DRAWINGS

The above and other objects, features and advantages of the present invention will be more clearly understood from the following detailed description taken in conjunction with the accompanying drawings, in which:

FIG. 1 is a table illustrating the comparison between voltage levels of LVTTL and high-speed I/O interface;

DETAILED DESCRIPTION OF THE PREFERRED EMBODIMENTS

Figure 7:
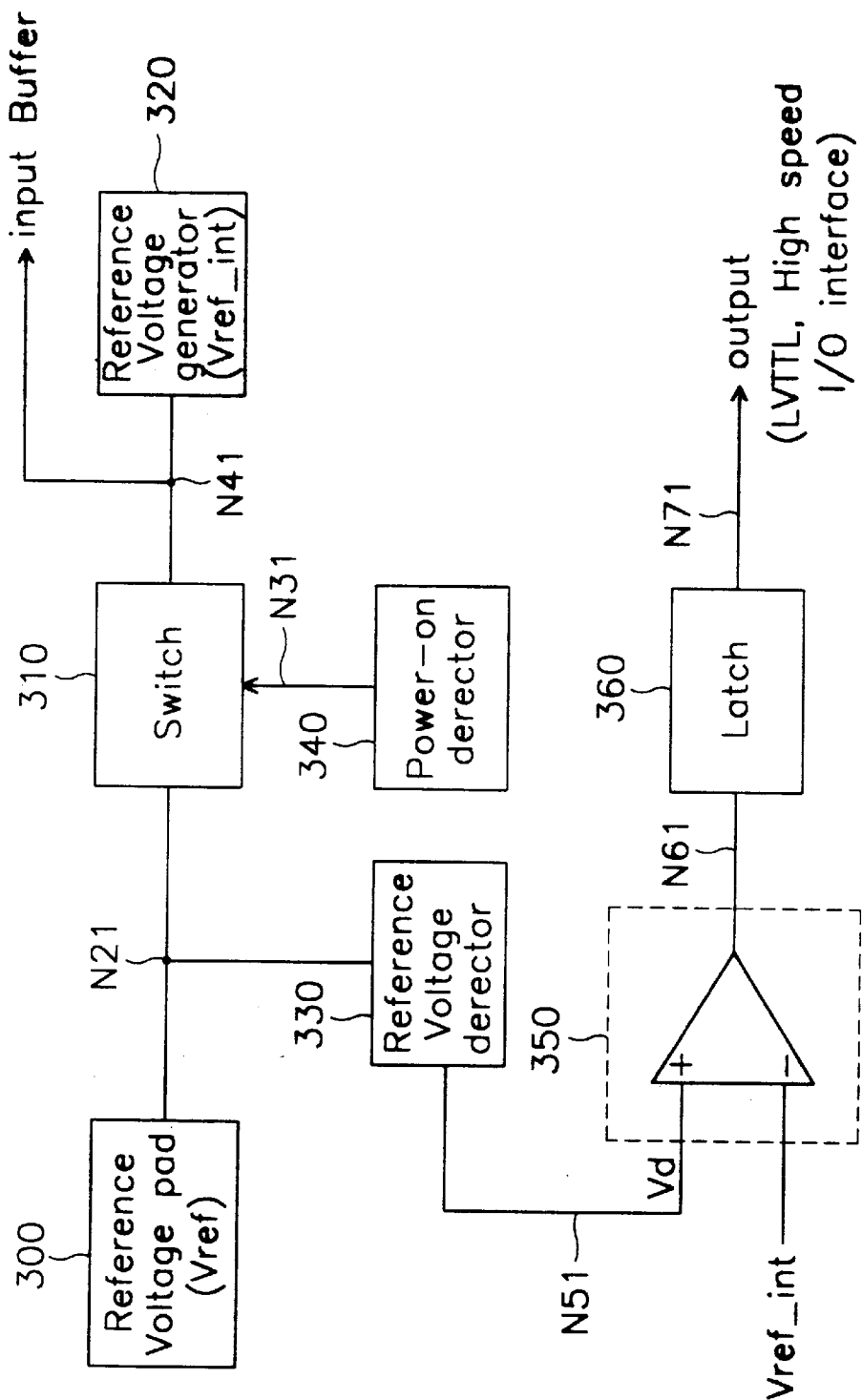
FIG. 7 is a block diagram illustrating the construction of an automatic mode selection circuit for a semiconductor memory device in accordance with an embodiment of the present invention.

Referring to FIG. 7, there is shown a block diagram of an automatic mode selection circuit for a semiconductor memory device in accordance with an embodiment of the present invention. As shown in this drawing, the automatic mode selection circuit comprises an external reference voltage pad 300 for delivering an external reference voltage Vref, an internal reference voltage generator 320 for generating an internal reference voltage Vref_int, and a switching circuit 310 connected between the external reference voltage pad 300 and the internal reference voltage generator 320.

The automatic mode selection circuit further comprises a power-on detector 340 connected to the switching circuit 310. The power-on detector 340 is adapted to detect a power-on time point and then generate a pulse signal for a predetermined time period. The switching circuit 310 is operated in response to an output signal from the power-on detector 340 to temporarily turn off the external reference voltage pad 300 and the internal reference voltage generator 320.

The automatic mode selection circuit further comprises a reference voltage detector 330 connected between the external reference voltage pad 300 and the switching circuit 310. The reference voltage detector 330 is adapted to detect the external reference voltage Vref from the external reference voltage pad 300. If the reference voltage detector 330 detects the external reference voltage Vref from the external reference voltage pad 300, the present mode is a high-speed I/O interface mode. On the contrary, if the reference voltage detector 330 detects no voltage from the external reference voltage pad 300, the present mode is an LVTTL mode.

The automatic mode selection circuit further comprises a comparator 350 for comparing an output voltage Vd from the reference voltage detector 330 with the internal reference voltage Vref_int from the internal reference voltage generator 320 in response to the output signal from the power-on detector 340, and a latch circuit 360 connected to an output terminal of the comparator 350. Upon the generation of an output signal from the latch circuit 360, the switching circuit 310 connects the external reference voltage pad 300 and the internal reference voltage generator 320 to each other and then supplies a voltage at a node N41 to an input buffer. The latch circuit 360 may supply its output signal for discrimination between the LVTTL and high-speed I/O interface modes to a data output buffer.

For example, in a semiconductor memory device such as a synchronous dynamic random access memory, a mode register set operation must be performed to prescribe states in the chip such as a burst length, a delay time of a signal CAS, etc. after power is turned on.

For example, in a semiconductor memory device such as a synchronous dynamic random access memory, a mode register set operation must be performed to prescribe states in the chip such as a burst length, a delay time of a signal CAS, etc. after power is turned on.

Figure 8:
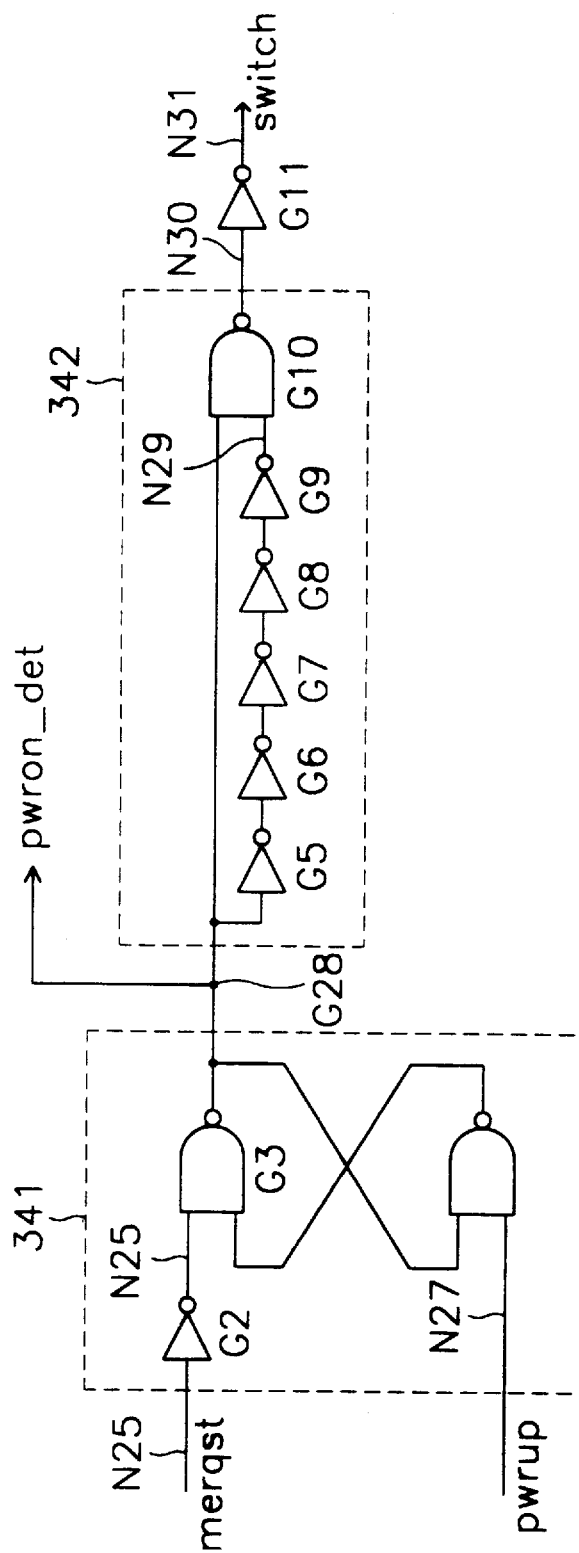
FIG. 8 is a detailed circuit diagram of a power-on detector in FIG. 7.

Referring to FIG. 8, there is shown a detailed circuit diagram of the power-on detector 340 in FIG. 7. As shown in this drawing, the power-on detector 340 includes an inverter G2, a latch circuit 341 and a delay circuit 342. The inverter G2 is connected between nodes N25 and N26. The latch circuit 341 includes two NAND gates G3 and G4 connected among the node N26 and nodes N27 and N28. The node N25 is applied with a mode register set signal mregst and the node N27 is applied with a power-up signal pwrup. The delay circuit 342 includes five inverters G5–G9 connected in series between the node N28 and a node N29, a NAND gate G10 for NANDing signals at the nodes N28 and N29 and supplying the NANDed result to a node N30, and an inverter G11 connected to the node N30. A power-on detection signal pwron_det is supplied through the node N28. The inverter G11 provides its output signal to the switching circuit 310.

Figure 9:
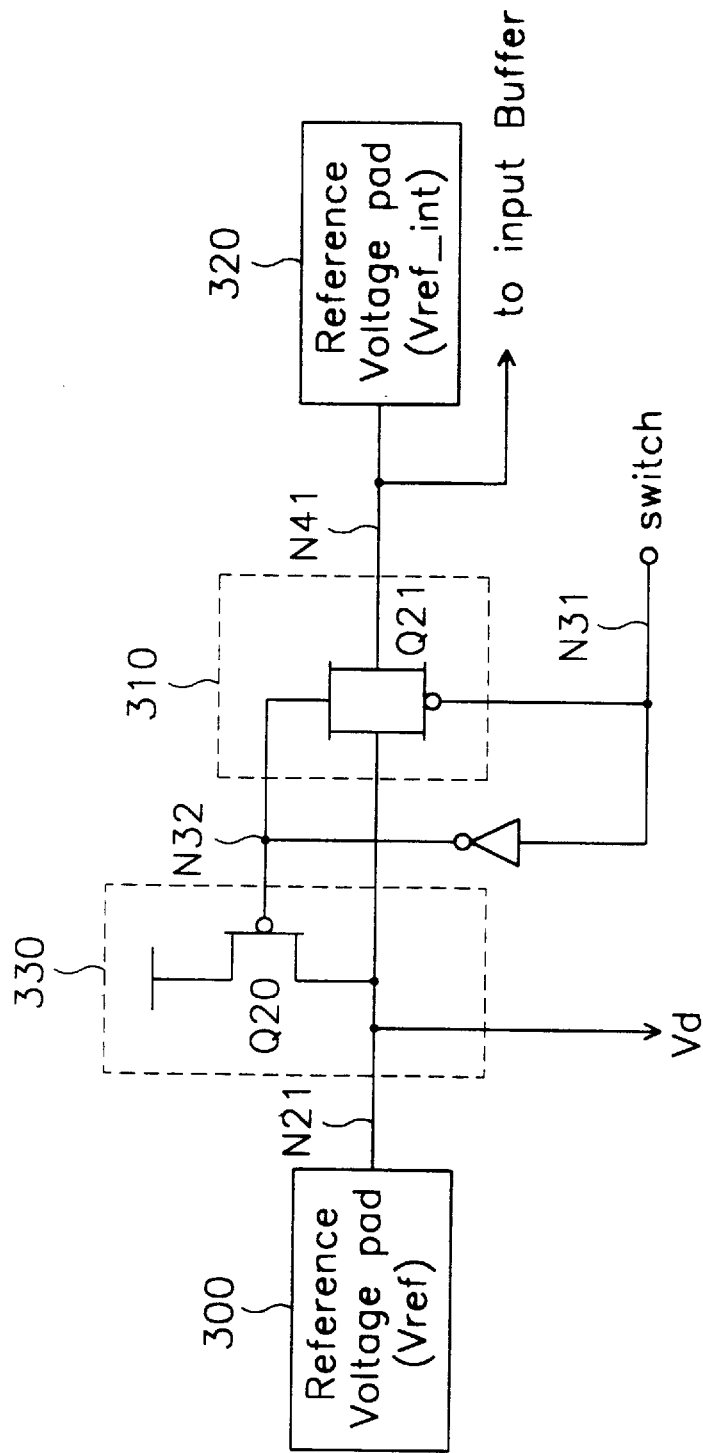
FIG. 9 is a detailed circuit diagram of a reference voltage detector and a switching circuit in FIG. 7.

Referring to FIG. 9, there is shown a detailed circuit diagram of the reference voltage detector 330 and switching circuit 310 in FIG. 7. As shown in this drawing, the reference voltage detector 330 includes a PMOS transistor Q20 connected between a supply voltage source Vcc and a node N21. The PMOS transistor Q20 has its gate connected to a node N32. The switching circuit 310 includes a transfer transistor Q21 connected between a node N31 and the node N32. The node 31 is applied with the output signal from the power-on detector 340. The transfer transistor Q21 is adapted to switch voltages at the nodes N21 and N41. The node N21 is connected to the external reference voltage pad 300 and the node N41 is connected to the internal reference voltage generator 320.

Figure 10:
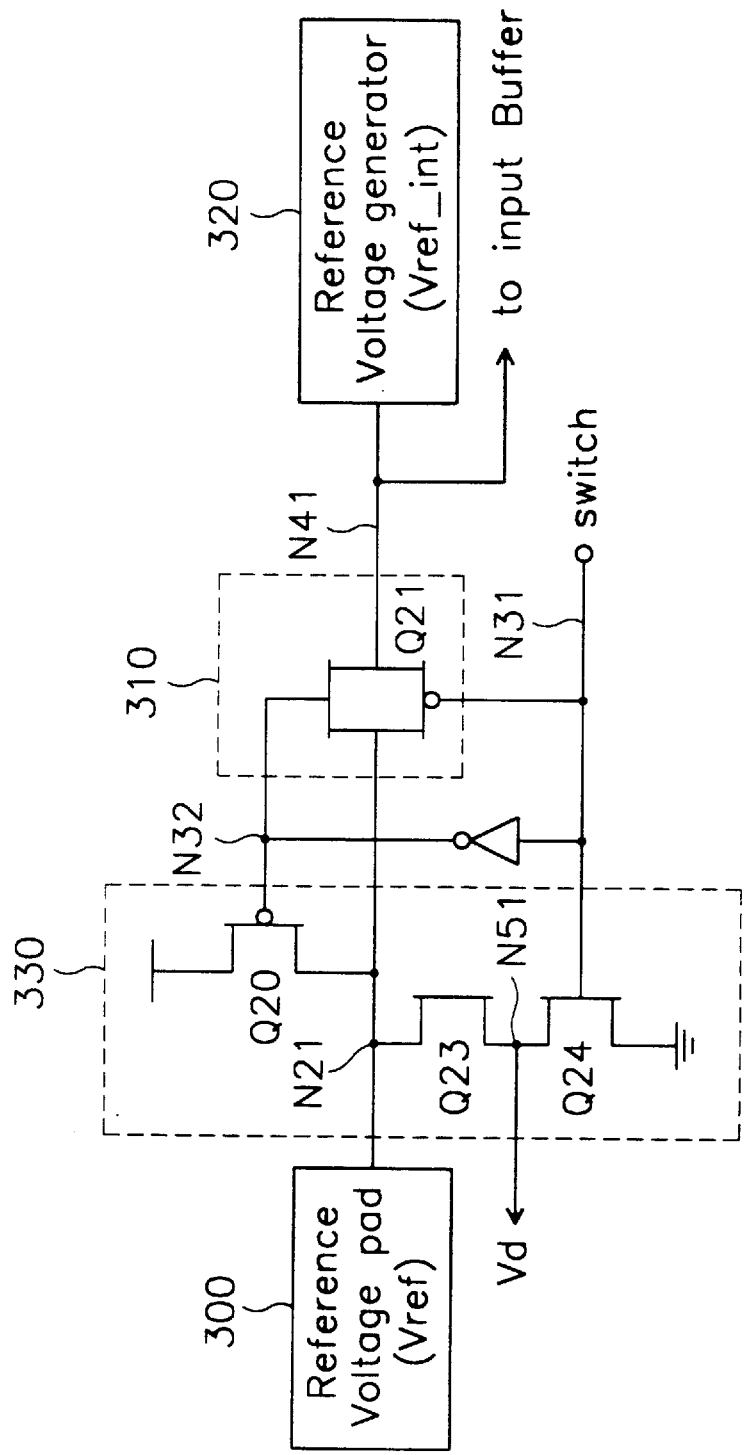
FIG. 10 is a detailed circuit diagram of an alternative embodiment of the reference voltage detector in FIG. 7.

Referring to FIG. 10, there is shown a detailed circuit diagram of an alternative embodiment of the reference voltage detector 330 in FIG. 7. As shown in this drawing, the reference voltage detector 330 includes an NMOS transistor Q23 connected between the node N21 and a node N51. The NMOS transistor Q23 has its gate connected to the supply voltage source Vcc. The node N21 is connected to the external reference voltage pad 300 and the node N51 is connected to the comparator 350.

The reference voltage detector 330 further includes an NMOS transistor Q24 connected between the node N51 and a ground voltage source Vss. The NMOS transistor Q24 has its gate connected to the node N31 which is applied with the output signal from the power-on detector 340.

The reference voltage detector 330 further includes an NMOS transistor Q22 connected between the supply voltage source Vcc and the node N21. The NMOS transistor Q22 has its gate connected in common to the switching circuit 310 and an inverter G12.

Figure 11:
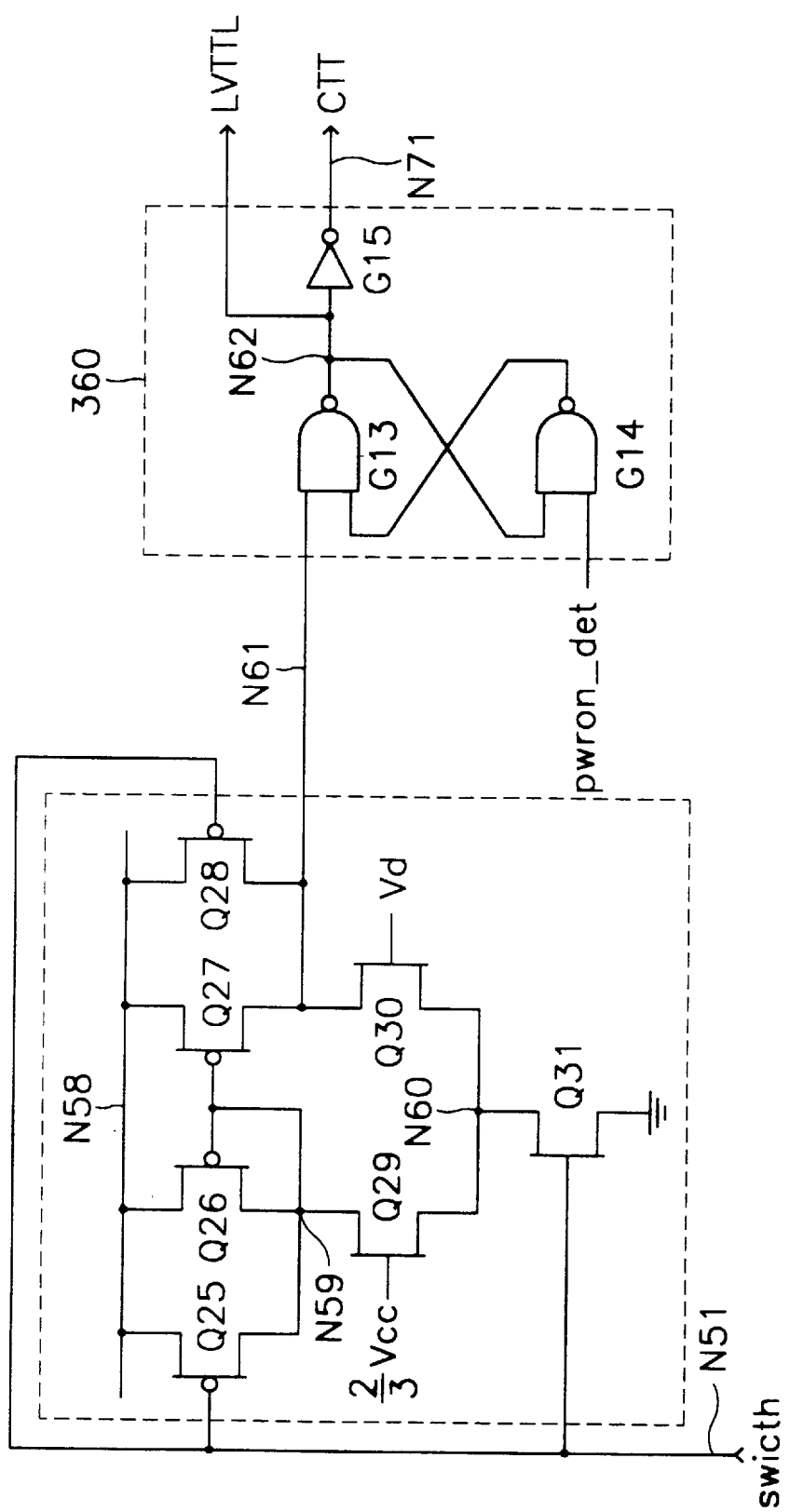
FIG. 11 is a detailed circuit diagram of a comparator and a latch circuit in FIG. 7.

Referring to FIG. 11, there is shown a detailed circuit diagram of the comparator 350 and latch circuit 360 in FIG. 7. As shown in this drawing, the comparator 350 includes PMOS transistors Q25 and Q26 connected in parallel between nodes N58 and N59, an NMOS transistor Q29 connected between the node N59 and a node N60, PMOS transistors Q27 and Q28 connected in parallel between the node N58 and a node N61, an NMOS transistor Q30 connected between the node N61 and the node N60, and an NMOS transistor Q31 connected between the node N60 and the ground voltage source Vss. The PMOS transistor Q25 has its gate connected to the node N51 and the PMOS transistor Q26 has its gate connected to the node N59. The NMOS transistor Q29 has its gate for inputting a voltage 2Vcc/3 from a voltage generator, the PMOS transistor Q27 has its gate connected to the node N59 and the PMOS transistor Q28 has its gate connected to the node N51. The NMOS transistor Q30 has its gate connected to the external reference voltage pad 300 and the NMOS transistor Q31 has its gate connected to the node N51. The latch circuit 360 includes two NAND gates G13 and G14 for latching a voltage at the node N61 and outputting the latched voltage to a node N62 which is connected to the LVTTL, and an inverter G15 connected between the node N62 and a node N71 which is connected to the high-speed I/O interface.

Figure 12:
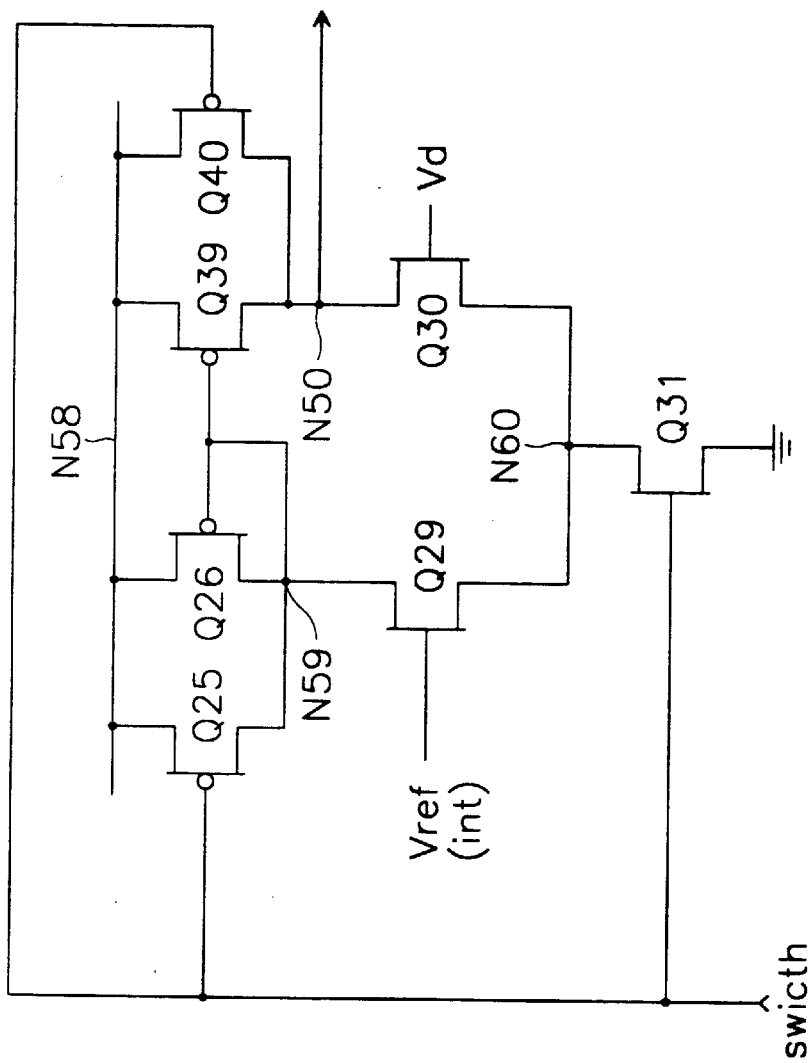
FIG. 12 is a detailed circuit diagram of an alternative embodiment of the comparator in FIG. 7.

Referring to FIG. 12, there is shown a detailed circuit diagram of an alternative embodiment of the comparator 350 in FIG. 7. The construction of FIG. 12 is the same as that of FIG. 11, with the exception that the NMOS transistor Q29 inputs the internal reference voltage Vref_int from the internal reference voltage generator 320 at its gate and the NMOS transistor Q30 inputs the output voltage Vd from the reference voltage detector 330 at its gate.

Figure 13:
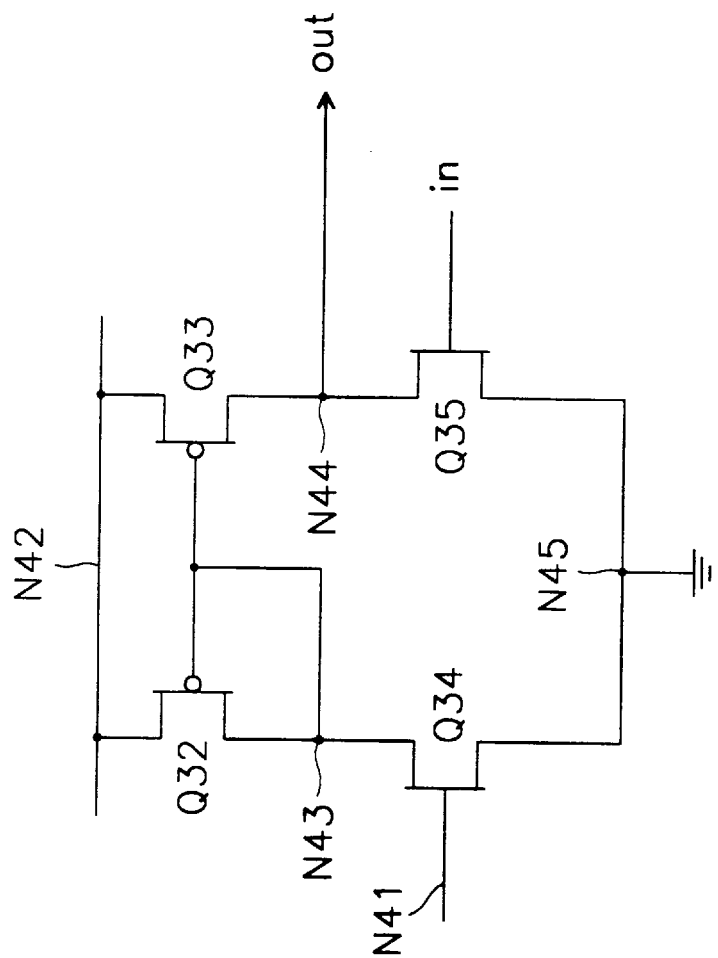
FIG. 13 is a detailed circuit diagram of an input buffer in FIG. 7.

Referring to FIG. 13, there is shown a detailed circuit diagram of the input buffer in FIG. 7. As shown in this drawing, the input buffer comprises a PMOS transistor Q32 connected between nodes N42 and N43, an NMOS transistor Q34 connected between the node N43 and a node N45, a PMOS transistor Q33 connected between the node N42 and a node N44, and an NMOS transistor Q35 connected between the nodes N44 and N45. The PMOS transistor Q32 has its gate connected to the node N43 and the PMOS transistor Q34 has its gate connected to the node N41. The PMOS transistor Q33 has its gate connected to the node N43 and the NMOS transistor Q35 has its gate for receiving an input signal in. The node N45 is connected to the ground voltage source Vss. With this construction, the input buffer acts to compare a voltage at the node N41 and the input signal in with each other and to output the compared result to the node N44.

Figure 14:
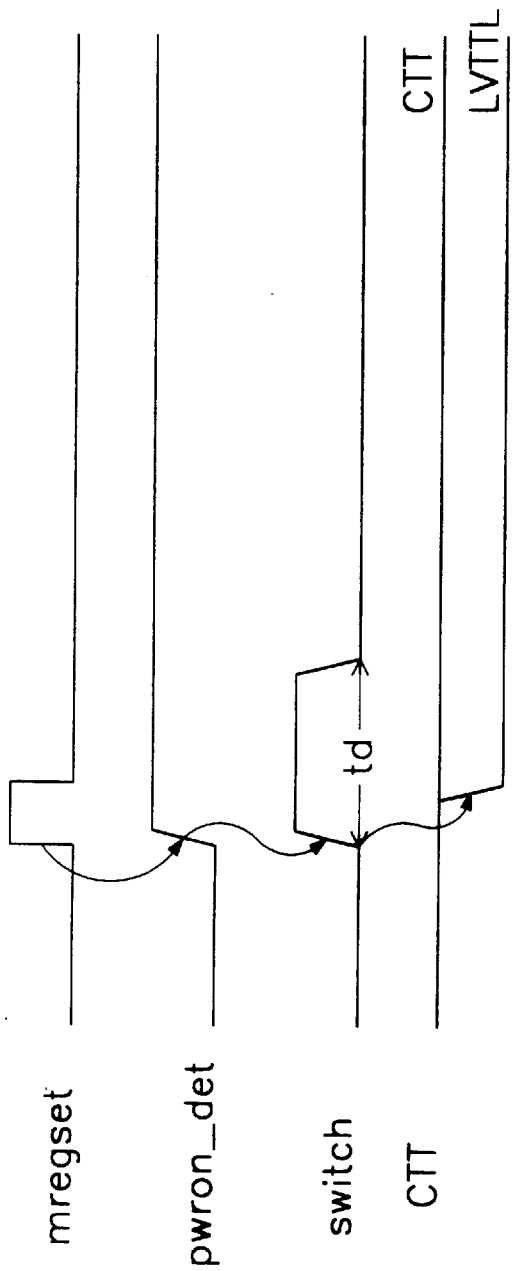
FIG. 14 is a waveform diagram illustrating the operation of the automatic mode selection circuit for the semiconductor memory device in accordance with the embodiment of the present invention.

The operation of the automatic mode selection circuit for the semiconductor memory device with the above-mentioned construction in accordance with the embodiment of the present invention will hereinafter be described in detail with reference to FIGS. 8 to 14. FIG. 14 is a waveform diagram illustrating the operation of the automatic mode selection circuit for the semiconductor memory device in accordance with the embodiment of the present invention.

First, in FIG. 8, when the mode register set signal mregst goes from low to high in logic and the power-up signal pwrup is high in logic, the latch circuit 341 supplies the power-on detection signal pwron_det of high logic level to the node N28. The inverters G5–G9, NAND gate G10 and inverter G11 cooperate to input the power-on detection signal pwron_det at the node N28 and output a high logic edge signal to the switching circuit 310. At this time, the edge signal has a pulse width delayed for the predetermined time period.

In FIG. 9, in response to the high logic switching signal from the power-on detector 340, the transfer transistor Q21 is turned off and the PMOS transistor Q20 is turned on. The transfer transistor Q21 and the PMOS transistor Q20 remain at their OFF and ON states for a propagation delay time of the inverters G5–G9, NAND gate G10 and inverter G11 in FIG. 8 (see FIG. 14). As the PMOS transistor Q20 is turned on, it supplies the output voltage Vd to the node N21.

In FIG. 11, the comparator 350 compares the output voltage Vd from the reference voltage detector 330 with the voltage 2Vcc/3 from the voltage generator and supplies the compared result to the latch circuit 360. At this time, the comparator 350 is controlled in response to the switching signal from the power-on detector 340.

Referring again to FIG. 9, when the switching signal from the power-on detector 340 goes from high to low in logic, the transfer transistor Q21 is turned on and the PMOS transistor Q20 is turned off. As a result, the external reference voltage pad 300 and the internal reference voltage generator 320 are connected to each other and the external reference voltage from the external reference voltage pad 300 is supplied to the input buffer through the node N41.

In FIG. 10, when the signal at the node N31 is high in logic, the transfer transistor Q21 is turned off and the PMOS transistor Q22 is turned on. As a result, the NMOS transistor Q23 transfers the supply voltage Vcc to the comparator 350 through the node N21.

In FIG. 12, the comparator 350 compares the output voltage Vd from the reference voltage detector 330 with the internal reference voltage Vref_int from the internal reference voltage generator 320 and supplies the compared result to the latch circuit 360. At this time, the comparator 350 is controlled in response to the switching signal from the power-on detector 340.

Figure 15:
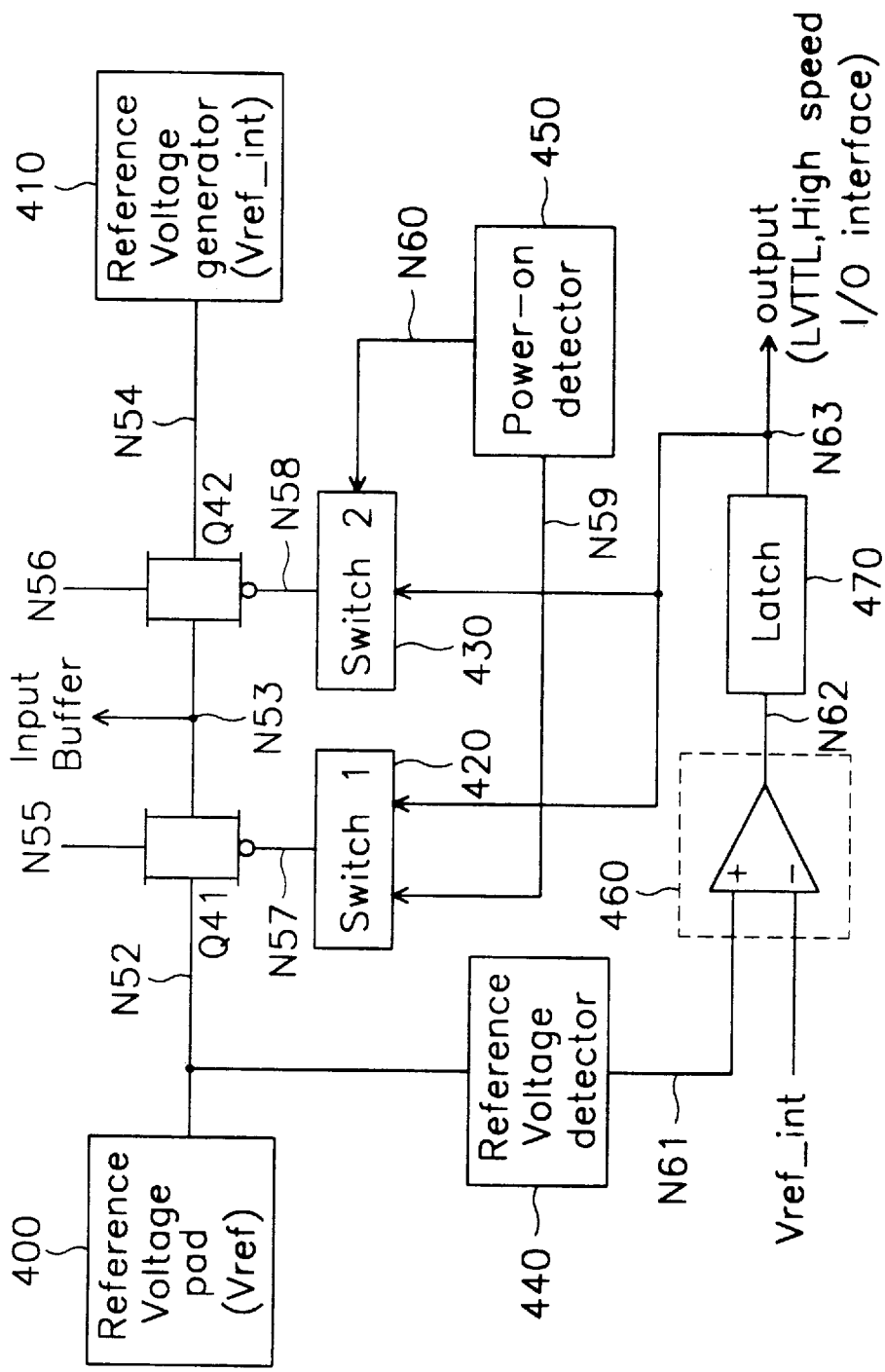
FIG. 15 is a block diagram illustrating the construction of an automatic mode selection circuit for a semiconductor memory device in accordance with an alternative embodiment of the present invention.

Referring to FIG. 15, there is shown a block diagram of an automatic mode selection circuit for a semiconductor memory device in accordance with an alternative embodiment of the present invention. As shown in this drawing, the automatic mode selection circuit comprises an external reference voltage pad 400 for delivering an external reference voltage Vref to a node N52, an internal reference voltage generator 410 for generating an internal reference voltage Vref_int and supplying the generated internal reference voltage Vref_int to a node N54, and transfer transistors Q41 and Q42 connected in series between the nodes N52 and N54 for transferring a signal at the node N52 or at the node N54 to an input buffer.

The automatic mode selection circuit further comprises a power-on detector 450 for detecting a power-on time point and then supplying a pulse signal with a predetermined period to nodes N59 and N60, a first switching circuit 420 connected among the node N59 and nodes N57 and N63 for performing a switching operation in response to a first switching signal from the power-on detector 450, and a second switching circuit 430 connected among a node N58 and the nodes N60 and N63 for performing a switching operation in response to a second switching signal from the power-on detector 450.

The automatic mode selection circuit further comprises a reference voltage detector 440 connected between the node N52 and a node N61 for detecting the external reference voltage Vref from the external reference voltage pad 400, a comparator 460 for comparing an output voltage from the reference voltage detector 440 with the internal reference voltage Vref_int from the internal reference voltage generator 410, and a latch circuit 470 for latching an output signal from the comparator 460 and supplying the latched signal to the node N63.

Figure 16:
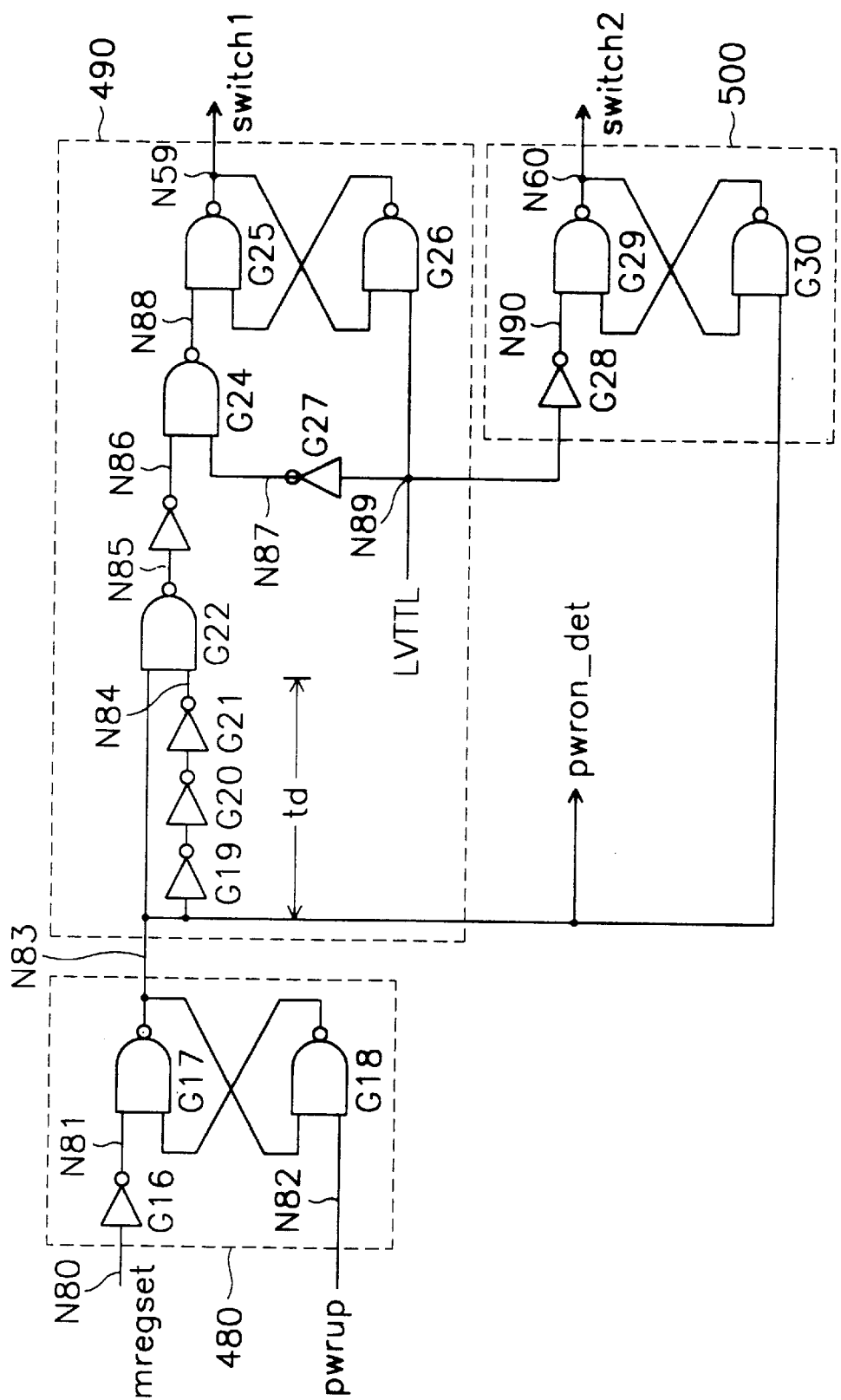
FIG. 16 is a detailed circuit diagram of a power-on detector in FIG. 15.

Referring to FIG. 16, there is shown a detailed circuit diagram of the power-on detector 450 in FIG. 15. As shown in this drawing, the power-on detector 450 includes an inverter G16, a latch circuit 480, and first and second switching signal generators 490 and 500. The inverter G16 is connected between nodes N80 and N81. The latch circuit 380 includes two NAND gates G17 and G18 connected among the node N81 and nodes N82 and N83. The node N80 is applied with a mode register set signal mregst and the node N82 is applied with a power-up signal pwrup. The first switching signal generator 490 includes three inverters G19–G21 connected in series between the node N83 and a node N84, a NAND gate G22 for NANDing signals at the nodes N83 and N84 and supplying the NANDed result to a node N85, an inverter G23 connected between the node N85 and a node N86, a NAND gate G24 for NANDing a signal at the node N86 and a signal at a node N87 and supplying the NANDed result to a node N88, an inverter G27 connected between the node N87 and a node N89, and two NAND gates G25 and G26 connected among the nodes N88, N59 and N89. The NAND gates G25 and G26 constitute a latch circuit. The first switching signal is supplied through the node N59. The second switching signal generator 500 includes an inverter G28 connected between the node N89 and a N90, and two NAND gates G29 and G30 connected among the nodes N90, N60 and N83. The second switching signal is supplied through the node N60.

Figure 17:
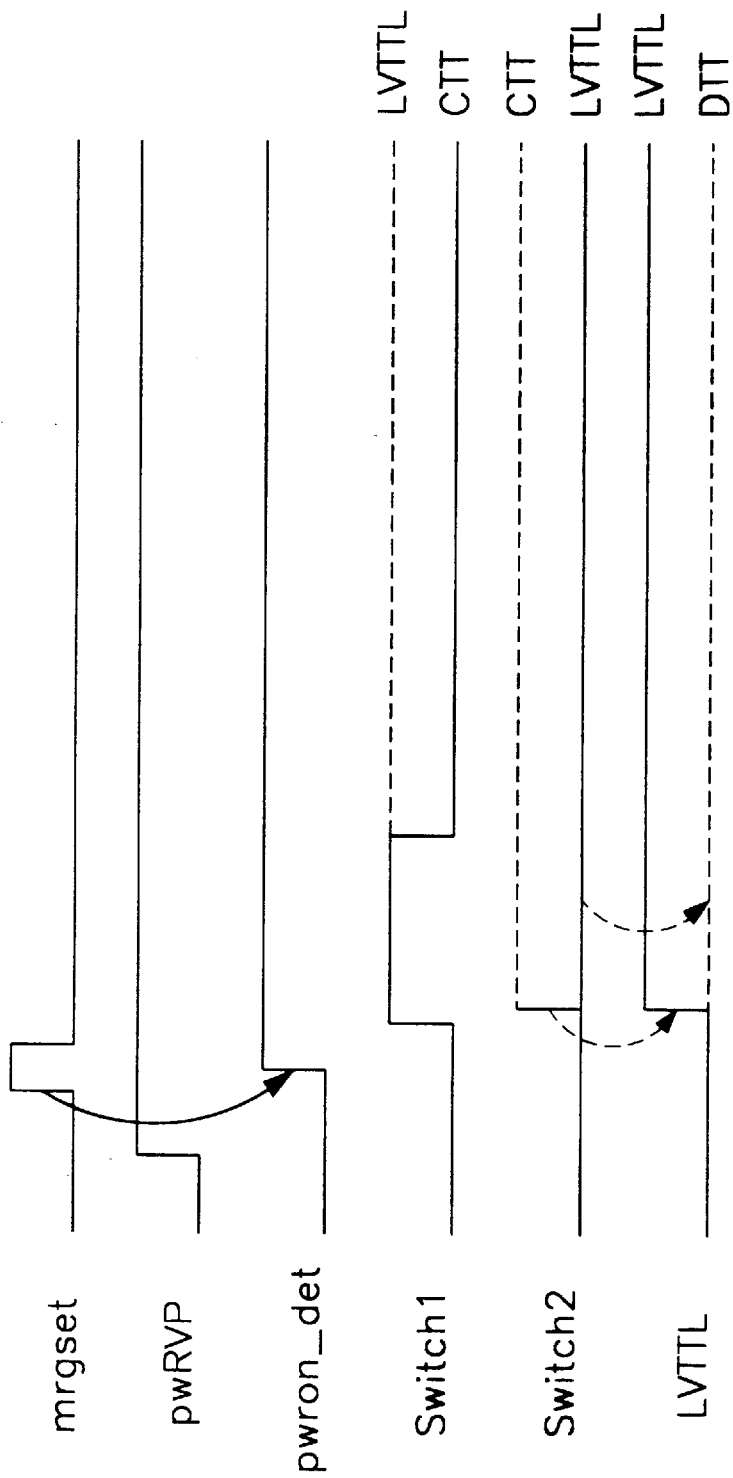
FIG. 17 is a waveform diagram illustrating the operation of the automatic mode selection circuit for the semiconductor memory device in accordance with the alternative embodiment of the present invention.

The operation of the automatic mode selection circuit for the semiconductor memory device with the above-mentioned construction in accordance with the alternative embodiment of the present invention will hereinafter be described in detail with reference to FIGS. 15 to 17. FIG. 17 is a waveform diagram illustrating the operation of the automatic mode selection circuit for the semiconductor memory device in accordance with the alternative embodiment of the present invention.

Upon detecting a power-on time point, the power-on detector 450 outputs the first and second switching signals to the first and second switching circuits 420 and 430, respectively. In response to the first switching signal from the power-on detector 450, the first switching circuit 420 turns the transfer transistor Q41 off. The second switching circuit 430 turns the transfer transistor Q42 on in response to the second switching signal from the power-on detector 450. In the case where the transfer transistor Q41 is turned on and the transfer transistor Q42 is turned off, the external reference voltage Vref from the external reference voltage pad 400 is supplied as a reference voltage to the input buffer through a node N53. In this case, the present mode is the high-speed I/O interface mode. On the contrary, in the case where the transfer transistor Q41 is turned off and the transfer transistor Q42 is turned on, the internal reference voltage Vref_int from the internal reference voltage generator 410 is supplied as the reference voltage to the input buffer through the node N53. In this case, the present mode is the LVTTL mode.

As mentioned above, in accordance with the present invention, the automatic mode selection circuit detects the reference voltage state when power is initially turned on. The automatic mode selection circuit then supplies the detected result to a component for discrimination between the LVTTL and high-speed I/O interface modes, such as a data output buffer. When the detection of the reference voltage state has been completed, the switching circuit 310 connects the external reference voltage pad 300 and the internal reference voltage generator 320 to each other so that they can be used in the input buffer.

The external reference voltage from the external reference voltage pad 300 is transferred to the input buffer in the high-speed I/O interface mode and the internal reference voltage Vref_int from the internal reference voltage generator 410 is transferred to the input buffer in the LVTTL mode. Therefore, no additional means is required to switch the LVTTL and high-speed I/O interface modes.

Figure 2:
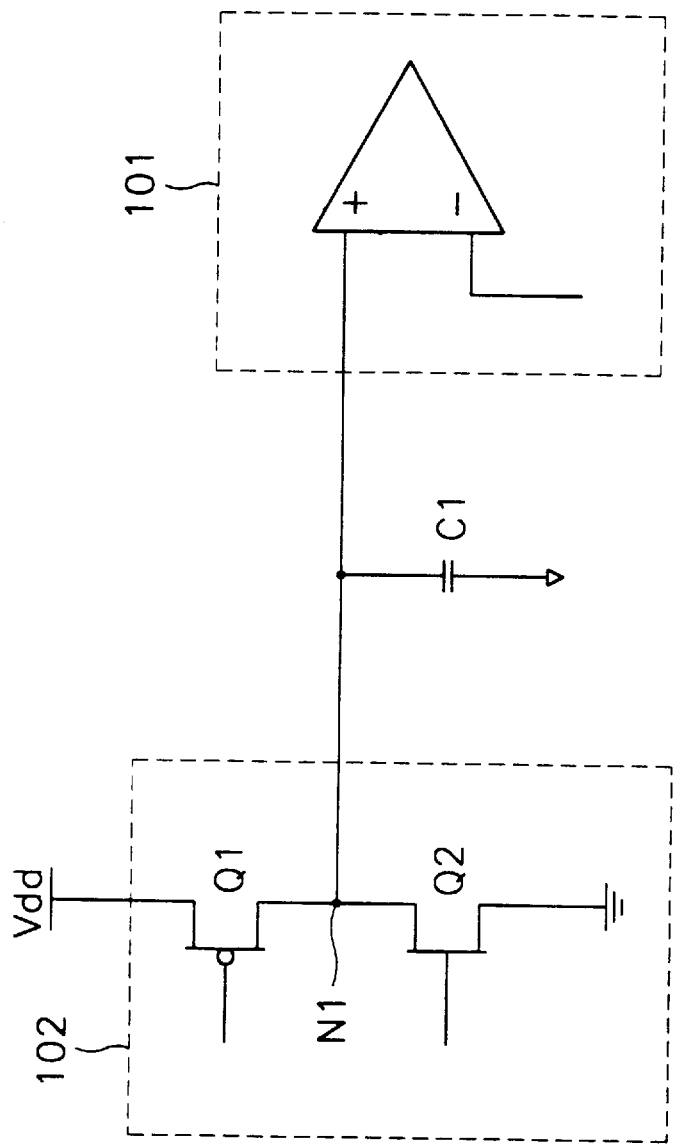
FIG. 2 is a circuit diagram illustrating one example of the LVTTL.
Figure 3:
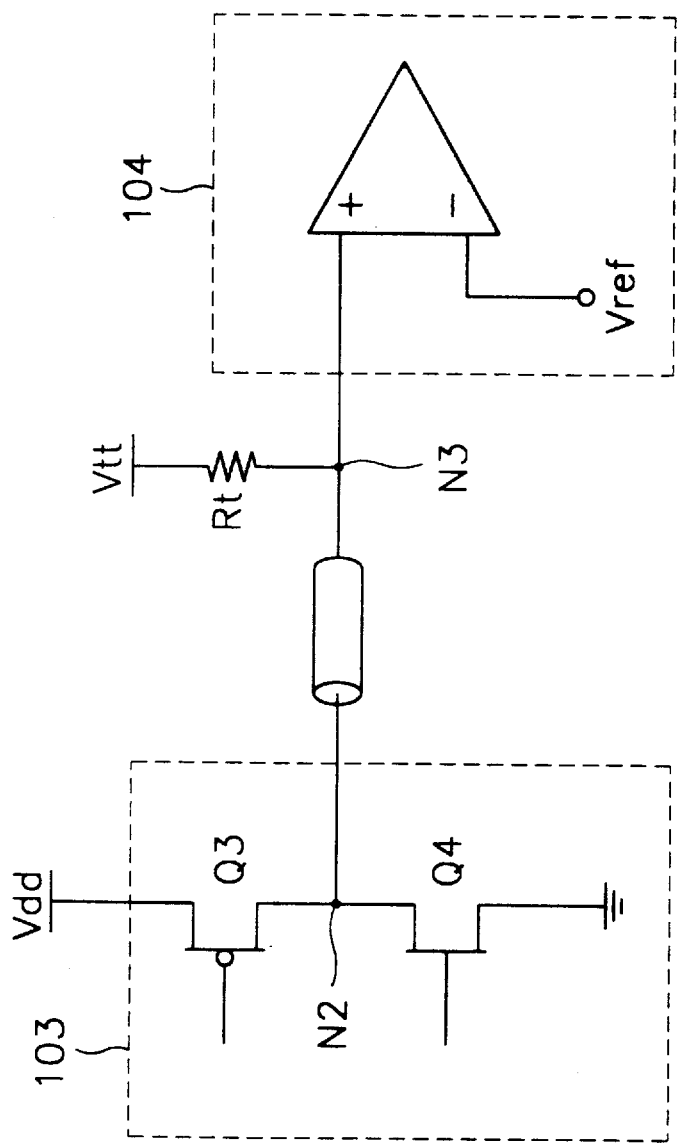
FIG. 3 is a circuit diagram illustrating one example of the high-speed I/O interface.
Figure 4:
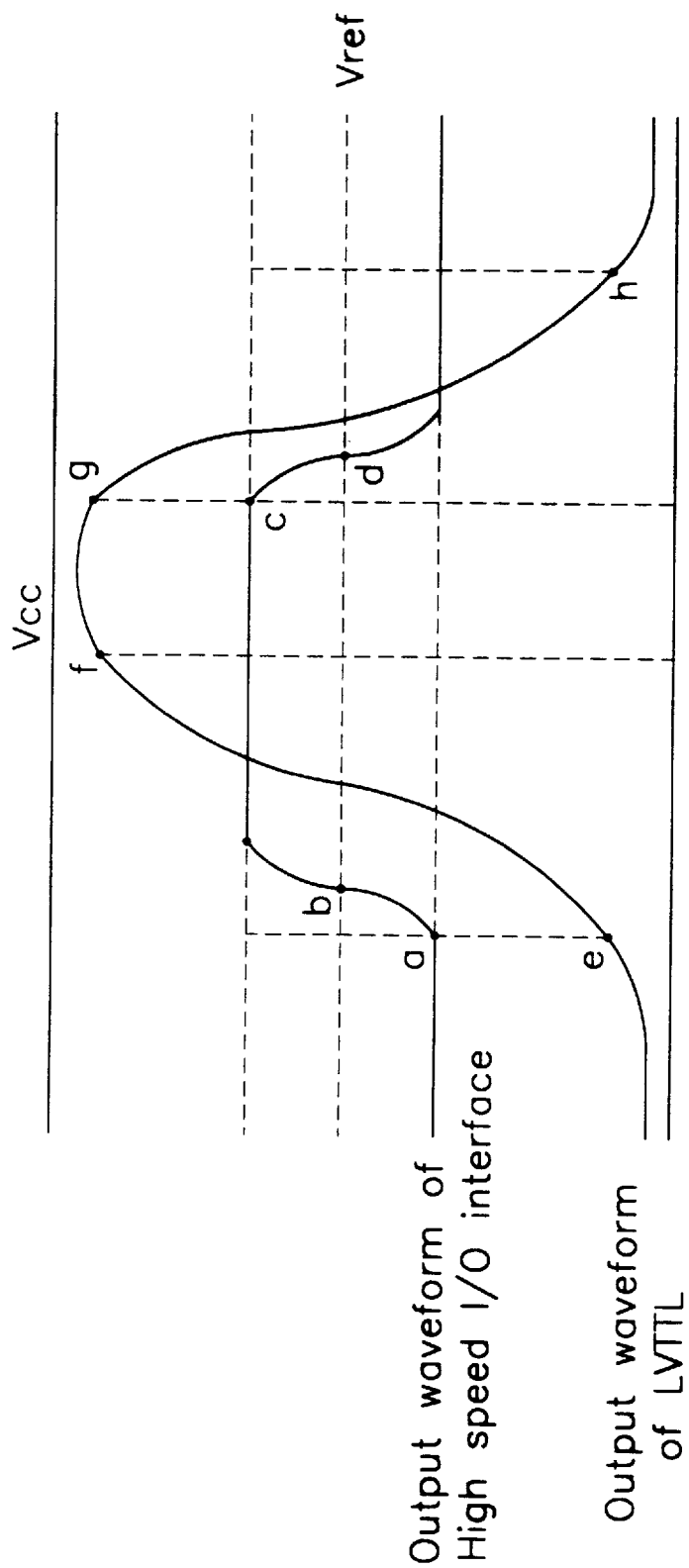
FIG. 4 is a waveform diagram illustrating output signals from the LVTTL and high-speed I/O interface in FIGS. 2 and 3.
Figure 5:
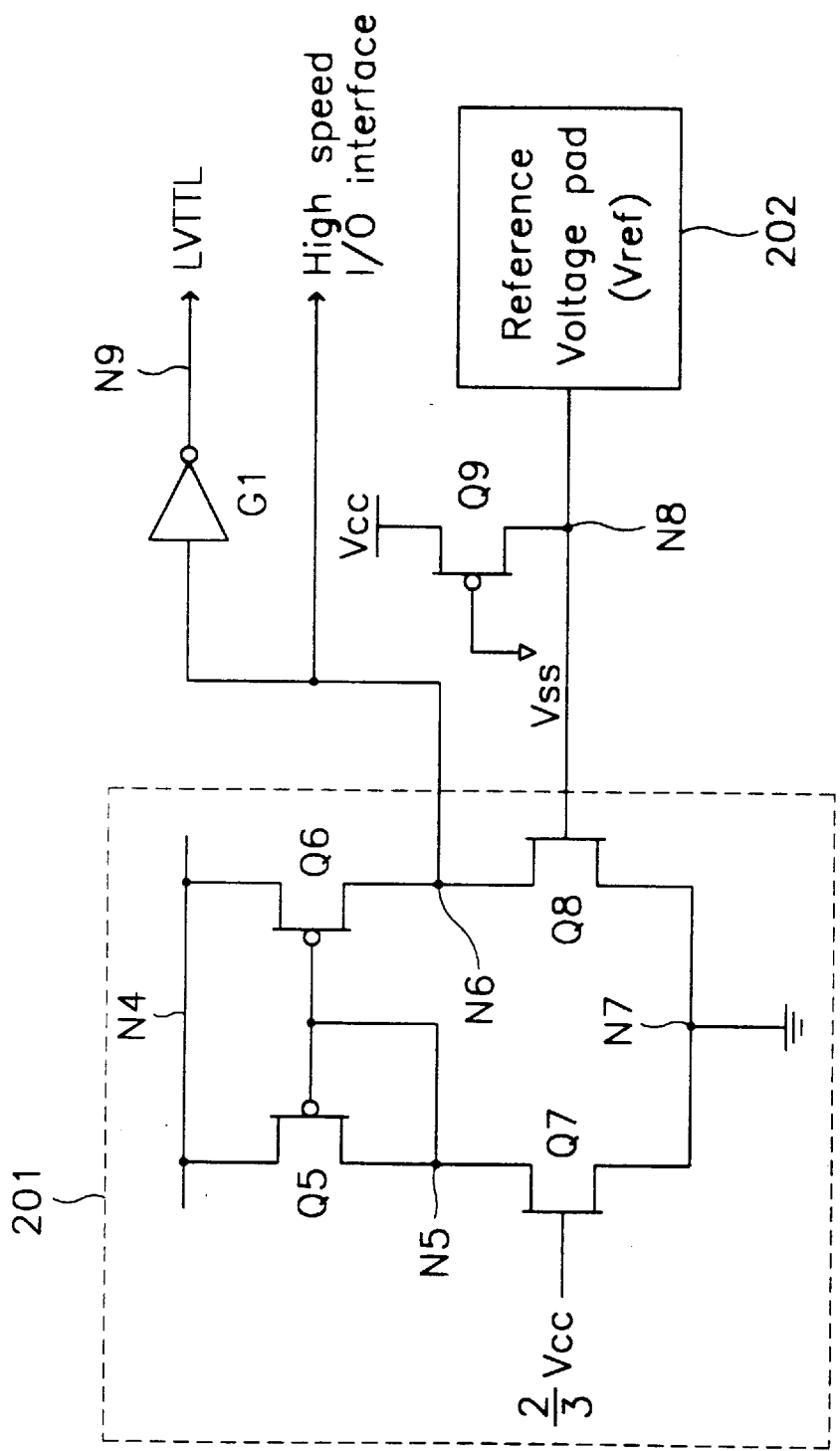
FIG. 5 is a circuit diagram illustrating the construction of a conventional automatic mode selection circuit for a semiconductor memory device.
Figure 6:
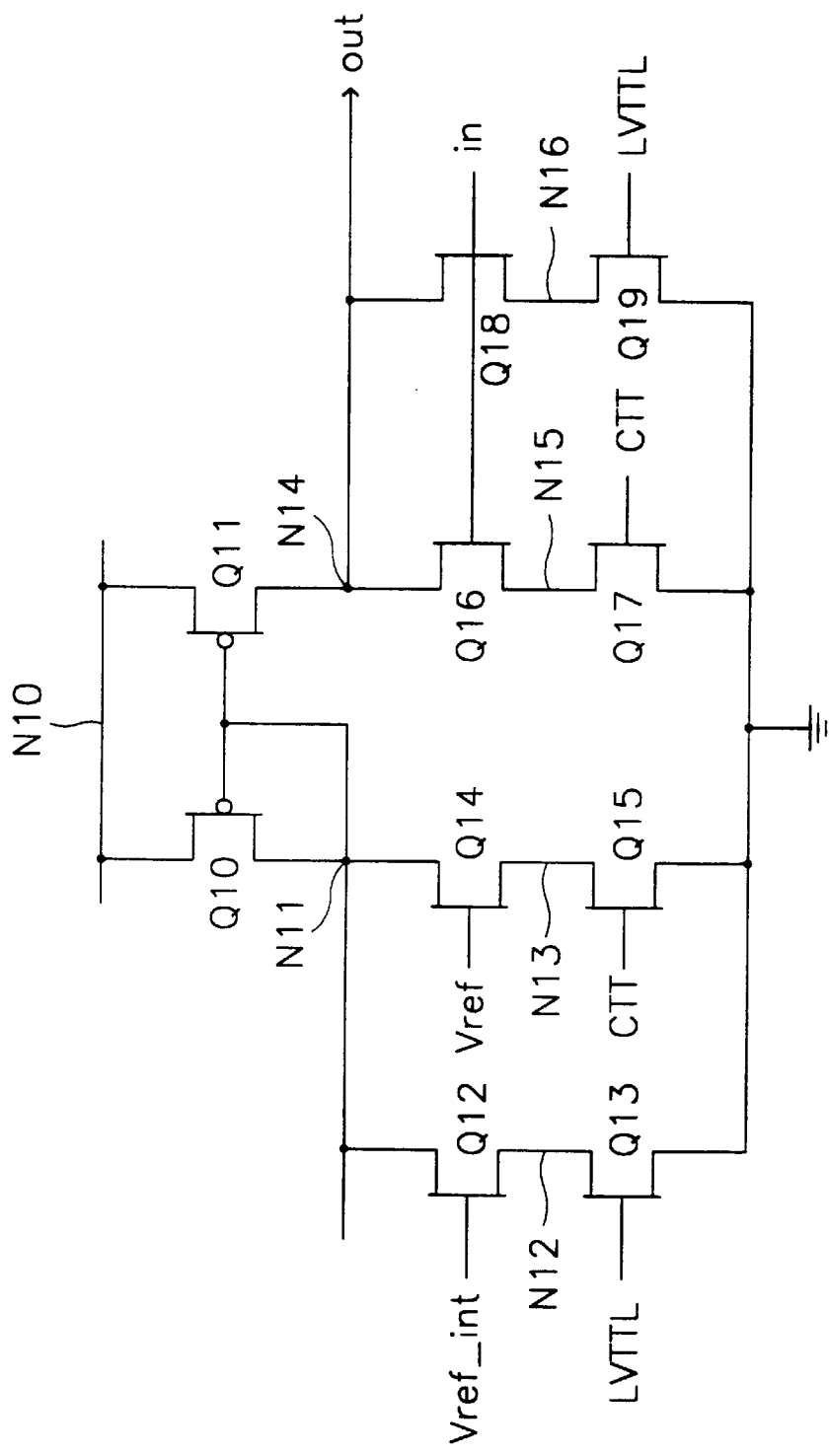
FIG. 6 is a circuit diagram illustrating the construction of a conventional input buffer for a semiconductor memory device.

The PMOS transistors Q20 and Q23 remain at their ON states only for an interval that the transfer transistor Q21 remains at its OFF state. Therefore, even in the case where the high-speed I/O interface mode is selected, the PMOS transistors Q20 and Q22 form no current path to the external reference voltage pad 300 differently from the PMOS transistor Q9 in FIG. 5.

In FIG. 12, the comparator 350 inputs the internal reference voltage Vref_int from the internal reference voltage generator 410. Therefore, there is no necessity for using the voltage generator for generating the voltage 2Vcc/3.

In FIG. 10, assuming that the PMOS transistor Q22 has an impedance lower than that of the NMOS transistor Q23, and Q23:Q24=R:3R, where is a resistance, the output voltage Vd from the reference voltage detector 330 can be obtained as follows:

$$Vd \div 3Vref/4 = \tfrac{3}{4} \times (Vcc/2) = 3Vcc/8 \quad (1)$$

$$Vd = 3Vcc/4 = 6Vcc/8 \quad (2)$$

$$Vref\_int = Vcc/2 = 4Vcc/8$$

The above equation (1) corresponds to the high-speed I/O interface mode and the above equation (2) corresponds to the LVTTL mode. The LVTTL and high-speed I/O interface modes can be discriminated therebetween on the basis of the above equations (1) and (2).

As apparent from the above description, according to the present invention, the automatic mode selection circuit for the semiconductor memory device can automatically select the two modes of LVTTL and high-speed I/O interface in the chip. Therefore, the present invention has the effect of reducing an occupied area on the chip and enhancing the operation speed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

I claim:

1. An automatic mode selection circuit for automatically selecting low voltage transistor transistor logic and high-speed input/output interface modes in a semiconductor memory device, comprising:

external reference voltage delivery means for generating an external high-speed input/output reference voltage when a high-speed input/output mode is operating;

internal reference voltage generation means for generating an internal transistor transistor logic reference voltage;

power-on detection means for detecting a power-on time point and then generating a pulse signal for a predetermined time period;

switching means for switching the external reference voltage from said external reference voltage delivery means and the internal reference voltage from said internal reference voltage generation means in response to an output signal from said power-on detection means;

reference means detection means connected between said external reference voltage delivery means and said switching means for detecting whether the external reference voltage from said external reference voltage delivery means is present, said reference voltage detection means being adapted to output a difference voltage level in each case by detecting the external reference voltage from said external voltage delivery means in the high-speed input/output interface mode or a power supply voltage in the low voltage transistor transistor logic mode;

comparison means for comparing an output voltage from said reference voltage detection means with the internal reference voltage from said internal reference voltage generation means in response to the output signal from said power-on detection means, said comparison means being adapted to compare the output voltage level from said reference voltage detection means with a ⅔ voltage level of the power supply voltage; and latch means for latching an output signal from said comparison means and supplying the latched signal to an output terminal.

2. An automatic mode selection circuit as set forth in claim 1, wherein said power-on detector means includes:

inversion means for inverting a mode register set signal;

latch means for generating a power-on detection signal in response to an output signal from said inversion means and a power-on signal; and delay means for delaying the power-on detection signal from said latch means and supplying the delayed power-on detection signal as a switching signal to said switching means.

3. An automatic mode selection circuit as set forth in claim 1, wherein said switching means includes a transfer transistor connected between said external reference voltage delivery means and said internal reference voltage generation means, for switching the external reference voltage from said external reference voltage delivery means and the internal reference voltage from said internal reference voltage generation means in response to the output signal from said power-on detection means.

4. An automatic mode selection circuit as set forth in claim 1, wherein said reference voltage detection means includes a PMOS transistor connected between a supply voltage source and a node between said external reference voltage delivery means and said internal reference voltage generation means, said PMOS transistor being controlled in response to an output signal from said switching means and the output signal from said power-on detection means.

5. An automatic mode selection circuit as set forth in claim 1, wherein said reference voltage detection means includes:

a PMOS transistor connected between a supply voltage source and a node between said external reference voltage delivery means and said internal reference voltage generation means, said PMOS transistor being controlled in response to an output signal from said switching means and the output signal from said power-on detection means;

a first NMOS transistor connected between said node and said comparison means, said first NMOS transistor having its gate connected to said supply voltage source; and a second NMOS transistor connected between said comparison means and a ground voltage source, said second NMOS transistor having its gate for inputting the output signal from said power-on detection means.

6. An automatic mode selection circuit as set forth in claim 1, further comprising an input buffer connected between said switching means and said internal reference voltage generation means, said input buffer comparing a signal transferred by said switching means with an input signal.

7. An automatic mode selection circuit with an output terminal for automatically selection low voltage transistor transistor logic and high-speed input/output interface modes in a semiconductor memory device, comprising:

external reference voltage delivery means for delivering an external high-speed input/output reference voltage;

internal reference voltage generation means for generating an internal transistor transistor logic reference voltage;

power-on detection means for detecting a power-on time point and then generating a pulse signal for a predetermined time period;

first and second switching means for switching the external reference voltage from said external reference voltage delivery means and the internal reference voltage from said internal reference voltage generation means in response to first and second switching signals from said power-on detection means and an output signal from said output terminal;

reference voltage detection means connected between said external reference voltage delivery means and said switching means for detecting the external reference voltage from said external reference voltage delivery means, said reference voltage detection means being adapted to output a difference voltage level in each case by detecting the external reference voltage from said external voltage delivery means in the high-speed input/output interface mode or a power supply voltage in the low voltage transistor transistor logic mode;

comparison means for comparison an output voltage from said reference voltage detection means with the internal reference voltage from said internal reference voltage generation means when said first and second switching means are temporarily turned off, said comparison means being adapted to compare the output voltage level from said reference voltage detection means with a ⅔ voltage level of the power supply voltage; and latch means for latching an output signal from said comparison means and supplying the latched signal to said output terminal.

8. An automatic mode selection circuit as set forth in claim 7, wherein said power-on detection means includes:

inversion means for inverting a mode register set signal;

latch means for generating a power-on detection signal in response to an output signal from said inversion means and a power-up signal; and first and second switching signal generation means for generating the first and second switching signals in response to the power-on detection signal from said latch means and a low voltage transistor transistor logic signal and supplying the generated first and second switching signals to said first and second switching means, respectively.

9. An automatic mode selection circuit for automatically selecting low voltage transistor transistor logic and high-speed input/output interface modes in a semiconductor memory device, comprising:

external reference voltage delivery means for delivering an external high-speed input/output reference voltage when a high-speed input/output mode is operating;

internal reference voltage generation means for generating an internal transistor transistor logic reference voltage;

power-on detection means for detecting power-on time point and then generating a pulse signal for a predetermined time period;

switching means for switching the external reference voltage from said external reference voltage delivery means and the internal reference voltage from said internal reference voltage generation means in response to an output signal from said power-on detection means;

reference voltage detection means connected between said external voltage delivery means and said switching means for detecting the external reference voltage from said external reference voltage delivery means;

comparison means for comparing an output voltage from said reference voltage detection means with the internal reference voltage from said internal reference voltage generation means in response to the output signal from said power-on detection means; and latch means for latching an output signal from said comparison means and supplying to an output terminal a power supply voltage in the low voltage transistor transistor mode and an external reference voltage in the high-speed input/output mode;

wherein said reference voltage detection means is adapted to output a different voltage level in each case by detecting the external reference voltage from said external reference voltage delivery means in the high-speed input/output interface mode or a power supply voltage in the low voltage transistor transistor logic mode, said comparison means is adapted to compare the output voltage level from said reference voltage detection means with a $\frac{2}{3}$ voltage level of the power supply voltage, said switching means includes a transfer transistor connected between said external reference voltage delivery means and said internal reference voltage generation means, for switching the external reference voltage from said external voltage delivery means and the internal reference voltage from said from said internal reference voltage generation means in response to the output signal from said power-on detection means, and said reference voltage detection means includes a PMOS transistor connected between a supply voltage source and a node between said external reference voltage delivery means and said internal voltage generation means, said PMOS transistor being controlled in response to an output signal from said switching means and the output signal from said power-on detection means.

* * * * *

UNITED STATES PATENT AND TRADEMARK OFFICE
CERTIFICATE OF CORRECTION

PATENT NO.   : 5,818,783
DATED        : October 6, 1998
INVENTOR(S)  : KIM

It is certified that error appears in the above-identified patent and that said Letters Patent is hereby corrected as shown below:

Column 11, line 17 replace "power-on" with --power-up--.

Signed and Sealed this

Twelfth Day of January, 1999

Attest:

Attesting Officer

Acting Commissioner of Patents and Trademarks